United States Patent [19]

Kashimura et al.

[11] Patent Number: 4,893,590
[45] Date of Patent: Jan. 16, 1990

[54] AUTOMOTIVE LIQUID-COOLED ELECTRONIC CONTROL APPARATUS

[75] Inventors: Yuichi Kashimura; Shizuhisa Watanabe, both of Katsuta; Seiji Suda, Mito, all of Japan

[73] Assignee: Hitachi, Ltd., Tokyo, Japan

[21] Appl. No.: 250,064

[22] Filed: Sep. 28, 1988

[30] Foreign Application Priority Data

Sep. 30, 1987 [JP] Japan .................. 62-243747

[51] Int. Cl.⁴ .............................................. F01P 1/06
[52] U.S. Cl. .............................. 123/41.31; 174/15.1; 165/80.4
[58] Field of Search .................... 123/41.31, 195 E; 165/80.4; 174/15.1

[56] References Cited

U.S. PATENT DOCUMENTS

| | | | |
|---|---|---|---|
| 3,965,971 | 6/1976 | Roggenkamp | 174/15 R |
| 4,364,355 | 12/1982 | Karino | 123/41.31 |
| 4,532,893 | 8/1985 | Day et al. | 123/41.31 |
| 4,729,424 | 3/1988 | Mizuno et al. | 165/80.4 |
| 4,763,611 | 8/1988 | Kobayashi et al. | 123/41.31 |

FOREIGN PATENT DOCUMENTS

| | | |
|---|---|---|
| 0084179 | 7/1983 | European Pat. Off. |
| 0225108 | 6/1987 | European Pat. Off. |
| 3026802 | 1/1981 | Fed. Rep. of Germany |
| 50-58987 | 5/1975 | Japan |
| 57-212345 | 12/1982 | Japan |

Primary Examiner—Noah P. Kamen
Attorney, Agent, or Firm—Antonelli, Terry & Wands

[57] ABSTRACT

An electronic control apparatus for use in an automobile has a base of a good thermal conductivity having one side disposed in contact with engine cooling water. Semiconductor devices are disposed on the other side of the base so that the semiconductor devices are maintained at the temperature of the engine cooling water, whereby the influence of high ambient air temperature to the semiconductor devices is reduced.

10 Claims, 3 Drawing Sheets

AUTOMOTIVE LIQUID-COOLED ELECTRONIC CONTROL APPARATUS

BACKGROUND OF THE INVENTION

The present invention relates to an electronic control apparatus for effecting control of an internal combustion engine mounted on an automobile or various other kinds of controls such as height control or brake control on the automobile.

In general, a typical electronic control apparatus for use in an automobile is disposed in a driver's or passenger's compartment and is connected by a considerably long wire harness to sensors, actuators or the like which are mounted in an engine compartment and on an internal combustion engine.

For this reason, external noise which may enter the wire harness has been a problem.

To solve the problem, such an electronic control apparatus may be provided in the engine compartment so that the wire harness can be made as short as possible.

However, if the electronic control apparatus is provided in the engine compartment, the temperature in the engine compartment raises a serious problem. More specifically, the air temperature in the engine compartment can be maintained at a considerably low temperature when an automobile is running since fresh air flows into the engine compartment. However, when the automobile is stopped after its high-speed running, air stagnates in the engine compartment and heated by the heat of the internal combustion engine, with the result that the air temperature in the engine compartment rises to a high level.

If the electronic control apparatus for an automobile is exposed to such a high temperature for a long time, then a problem occurs that semiconductor devices which constitute a part of the electronic control apparatus cannot maintain their normal functions.

For this reason, it is necessary to cool the electronic control apparatus for an automobile. As a cooling method, Japanese Patent Unexamined Publication No. 50-58987 proposes a method of cooling an electronic control apparatus for an automobile by using gasoline supplied to an internal combustion engine.

However, when gasoline is used as a cooling medium as described above, the following problems will be encountered:

(1) Since gasoline is introduced into the electronic control apparatus for an automobile, it is necessary to design a special sealed structure for anti-leak purposes. If a leakage of gasoline should occur, the possibility of fire is extremely high;

(2) Since gasoline is intended to absorb the heat generated in the electronic control apparatus for an automobile, the temperature of gasoline rises, so that vapor bubbles are easily produced, with the result that a vapor lock may occur in fuel injection valves.

SUMMARY OF THE INVENTION

It is an object of the present invention to provide an electronic control apparatus suitable for use in an automobile which is provided with a cooling structure capable of solving problems such as danger of fire and a vapor lock in a fuel injection valve.

To achieve the above and other objects, the present invention provides an electronic control apparatus for use in an automobile which comprises a base having one side in which a passage for circulation of an engine cooling water is formed and the other side on which semiconductor devices are disposed, the base being made of a material having a good thermal conductivity, and an enclosure fixed to the base to hermetically cover the semiconductor devices.

In the electronic control apparatus according to the present invention, the engine cooling water flows through the passage to maintain the temperature of the base and hence the temperature of the semiconductor devices at the temperature of the engine cooling water, whereby the influence of high-temperature air can be reduced.

The above and other objects, features and advantages of the present invention will become more apparent from the following description with reference to the accompanying drawings.

DESCRIPTION OF THE PREFERRED EMBODIMENTS

Preferred embodiments of the present invention will be described hereinunder with reference to the accompanying drawings.

Figure 3:
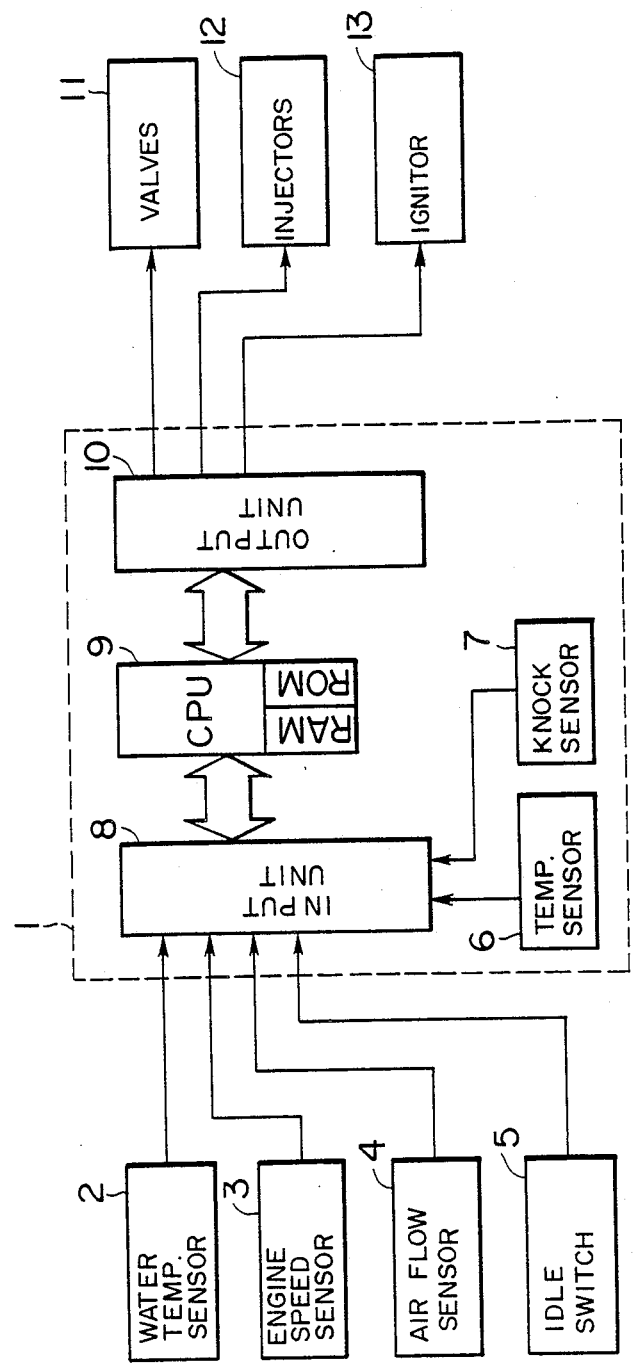
FIG. 3 is a block diagram of the electronic control apparatus.

FIG. 3 is a block diagram showing the essential construction of an electronic control apparatus suitable for use in an automobile. In the illustrated embodiment of the present invention, electronic control apparatus is for an internal combustion engine. The electronic control apparatus, which is represented generally by reference numeral 1, comprises a temperature sensor 6, a knock sensor 7, an input unit 8, an arithmetic unit 9 constituted by a RAM, a ROM and a CPU, and an output unit 10.

The input unit 8 is arranged to receive, through input wires, the output signals of a cooling water temperature sensor 2 for detecting the temperature of engine cooling water in an internal combustion engine, an engine speed sensor 3 for detecting the rotational speed of the internal combustion engine, an air flow sensor 4 for detecting the intake flow of air into the internal combustion engine, and an idle switch 5 for detecting when the engine is in an idle state.

An output unit 10 outputs control signals, through output wires, to valves 11 for effecting various kinds of compensation, to fuel injection valves 12 and to an ignition device 13.

Figure 1:
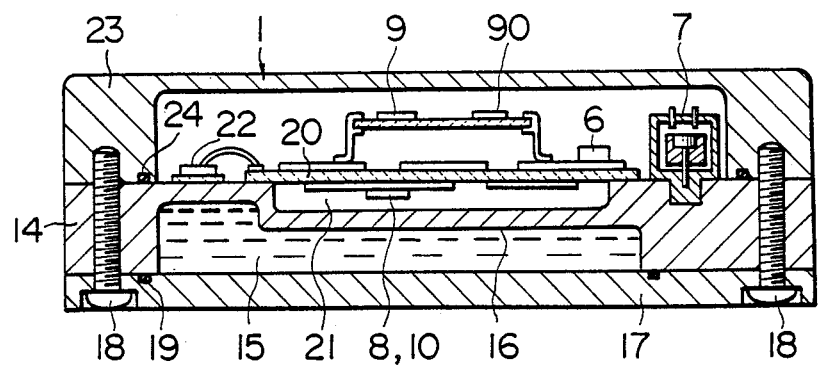
FIG. 1 is a cross sectional view of an embodiment of the present electronic control apparatus according to the present invention.
Figure 2:
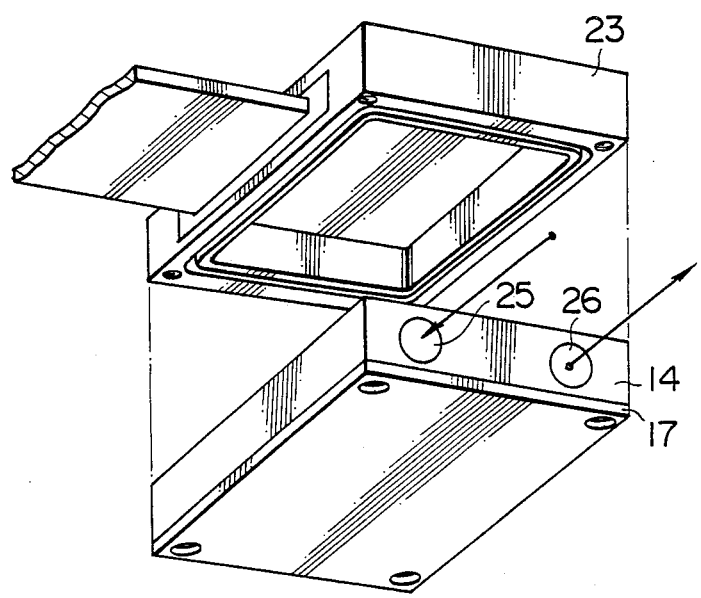
FIG. 2 is an exploded perspective view of the electronic control apparatus shown in FIG. 1.

The electronic control apparatus 1 is of a construction shown in FIGS. 1 and 2.

Referring to FIG. 1, reference numeral 14 denotes a base made of a thermally conductive material such as aluminum. A recess 16 is formed in one side of the base 14. A closure plate 17 of a thermally conductive material, such as aluminum, is fixed to the side of the base 14 to cooperate with the recess 16 to define a cooling water passage 15. A liquid-tight seal ring 19 is interposed between the closure plate 17 and the base 14.

Semiconductor devices are disposed on the other side of the base 14 and are directly or indirectly fixed to the base 14. In the embodiment shown in FIG. 1, the semiconductors are fixed to a ceramic board 20 which in turn is fixed to the base 14.

The input unit 8 and the output unit 10 are disposed on the surface of the ceramic board 20 which faces a space 21 between the ceramic board 20 and the base 14, while the arithmetic unit 9 is disposed on the other side of the ceramic board 20. In addition, on this side of the board 20, there is disposed a storage device 90 including a data ROM, a RAM and the like. The reason why the storage device 90 is disposed on the side of the base body 14 opposite to the space 21 is that the storage device 90 can be easily replaced by another one. An output transistor 22 is fixed to another ceramic board which is fixed to the base 14.

Furthermore, the temperature sensor 6 is of the thermistor-type and fixed to the ceramic board 20, while the knock sensor 7 is fixed to the base 14.

An enclosure 23 is fixed by the bolts 18 to the surface of the base 14 opposite to the closure plate 17. A liquid-tight seal ring 24 is interposed between the enclosure 23 and the base 14.

As shown in FIG. 2, an inlet 25 and an outlet 26 for circulation of the water which serves to cool the internal combustion engine are formed in one side wall of the base 14 and communicates with the water passage 15.

Figure 4:
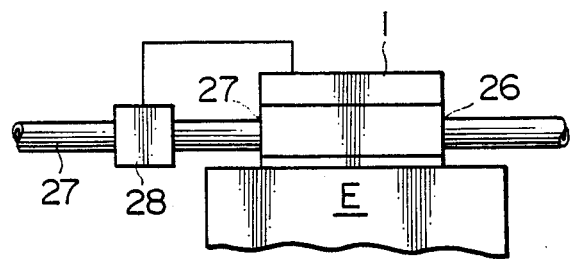
FIG. 4 is a schematic view illustrating the manner in which the electronic control apparatus is mounted on an internal combustion engine.

FIG. 4 shows the above-described electronic control apparatus 1 as being mounted on an internal combustion engine E. A flow control valve 28 is disposed at an intermediate position of a water introducing passage 27 for controlling the flow of the water.

Figure 5:
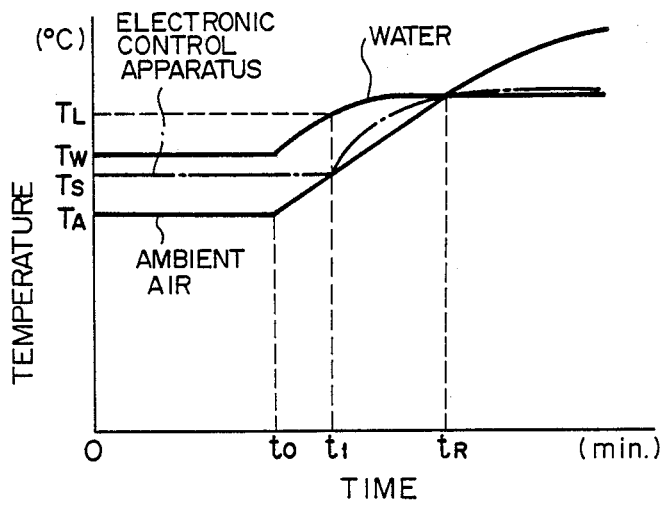
FIG. 5 is a graphic illustration of the temperature characteristic of the electronic control apparatus.

The operation of the electronic control apparatus 1 having the above-described construction will be described hereinunder with reference to FIG. 5.

While an automobile is running, air flows through an engine compartment. Accordingly, during the running of the automobile, the temperature of the air, the temperature of the water and the temperature of the electronic control apparatus 1 are kept substantially constant, as shown by lines $T_A$, $T_W$ and $T_S$ in FIG. 5, respectively. When the automobile is stopped at time point $t_0$, however, the temperature of the water and ambient temperature (or air temperature) within the engine compartment start to rise. Subsequently, when time $t_R$ is reached, the ambient temperature exceeds the temperature of the water. Accordingly, the flow control valve 28 is opened to cause the water to flow into the water passage 15 defined between the base 14 and the closure member 17 when the water temperature sensor 2 detects the fact that the water temperature has reached a temperature level $T_L$. The temperature of the electronic control apparatus 1 starts to rise at time $t_1$ following the temperature rise of the water until the temperature of the electronic control apparatus 1 generally coincides with the water temperature.

Accordingly, the electronic control apparatus 1 is not greatly influenced by ambient air of high temperature.

It is to be noted that the water temperature is normally maintained at about 80° C. and rises at times to a maximum of 130° C., whereas the ambient air temperature frequently rises to a far higher temperature. Accordingly, in accordance with the present invention, it is possible to sufficiently reduce the influence of the ambient temperature to the electronic control apparatus.

Although the temperature sensor 6 is provided on the base 14, the water temperature sensor 2 may be provided in place of the temperature sensor 6. The vibration of the internal combustion engine can be detected by the knock sensor 7.

Figure 6:
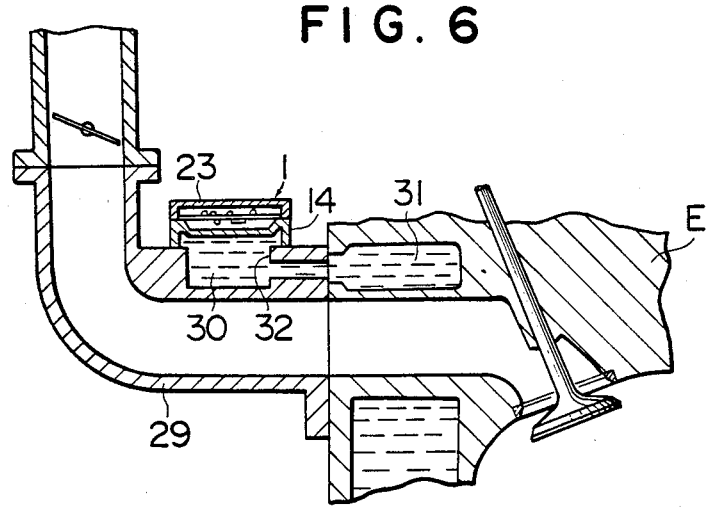
FIG. 6 is a fragmentary sectional view of an internal combustion engine on which another embodiment of the electronic control apparatus of the invention is mounted.

FIG. 6 shows a part of an engine on which a second embodiment of the electronic control apparatus 1 is mounted. As shown, the electronic control apparatus 1 is mounted on the top side of an intake manifold 29 in which a water passage 30 is formed. The water passage 30 communicates with a water passage 31 which is formed in the engine E. The water is circulated through the water passages 30 and 31 by means of a water pump (not shown). An opening 32 is formed in a portion of the top wall of the water passage 30 formed in the intake manifold 29. The base 14 is mounted on the intake manifold 29 in such a manner that the base 14 covers the opening 32. Accordingly, the temperature of the base 14 is maintained at the temperature of the water which flows through the water passage 30.

As described above, in accordance with the present invention, since the electronic control apparatus is arranged such that the engine cooling water flows therethrough, the temperature of the electronic control apparatus is maintained at the temperature of the engine cooling water. Thus the electronic control apparatus is not greatly influence by a raised ambient temperature. In addition, it is possible to solve various problems, such as fires or vapor locks, which may otherwise take place in the case where gasoline is used as a fuel for the engine and also used to cool the electronic control apparatus.

What is claimed is:

1. An electronic control apparatus for use in an automobile, comprising:
    (a) a base having a passage defined therein for circulation of an engine cooling water and semiconductor devices disposed on a side of said base, said base being made of a material having a good thermal conductivity; and
    (b) an enclosure fixed to said side of said base to hermetically cover said semiconductor devices;
    wherein a flow control valve is disposed at an inlet side of said passage, said flow control valve being arranged to open when a temperature of said engine cooling water has reached a predetermined temperature.

2. An electronic control apparatus according to claim 2, wherein a temperature sensor is disposed on said base.

3. An electronic control apparatus according to claim 1, wherein a temperature sensor is disposed on said base.

4. An electronic control apparatus for use in an automobile, comprising:
    (a) a base having a passage defined therein for circulation of an engine cooling water and semiconductor devices disposed on a side of said base, said base being made of a material having a good thermal conductivity; and
    (b) an enclosure fixed to said side of said base to hermetically cover said semiconductor devices:
    wherein a board for carrying said semiconductor devices is disposed between said base and said enclosure, input and output units being disposed between said board and said base, and an arithmetic unit and a data storage device being disposed between said board and said enclosure.

5. An electronic control apparatus for use in an automobile, comprising:
   (a) a first passage for cooling water formed in a wall of an intake manifold of an engine and having an opening which communicates with said first passage and opens to atmosphere;
   (b) a base mounted on said intake manifold so as to cover said opening of said first passage, said base having one side in which a second passage for circulation of the cooling water is formed, said second passage communicates with said opening and said first passage and another side on which semiconductor devices are disposed, said base being made of a material having a good thermal conductivity; and
   (c) an enclosure fixed to said another side of said base to hermetically cover said semiconductor devices.

6. An electronic control apparatus for use in an automobile, comprising:
   a base of a material having a good thermal conductivity;
   a closure member;
   said base having one side cooperating with said closure member to define a passage for the circulation of an engine cooling water; and
   semiconductor devices disposed on the other side of said base wherein a board for carrying said semiconductor devices is disposed between said base and an enclosure, said enclosure covering the other side of said base and said semiconductor devices, input and output units being disposed between said board and said base and an arithmetic unit and a data storage device being disposed on said board.

7. An electronic control apparatus according to claim 6, wherein a flow control valve is disposed at the inlet side of said passage, said flow control valve being arranged to open when the temperature of said engine cooling water has reached a predetermined temperature.

8. An electronic control apparatus according to claim 6, wherein a temperature is disposed on said base.

9. An electronic control apparatus according to claim 6, wherein a knock sensor is disposed on said base.

10. An electronic control apparatus for use in an automobile, comprising:
   a portion of an engine intake manifold which has a passage for cooling water and an opening which communicates with said passage;
   a base mounted on said intake manifold so as to cover said opening of said first passage, said base having one side facing said opening so that said one side is exposed to the cooling water;
   said base being made of a material having a good thermal conductivity;
   semiconductor devices disposed on the other side of said base; and
   an enclosure fixed to said base to hermetically cover said semiconductor devices.

* * * * *